US006816562B2

(12) United States Patent
Atkinson et al.

(10) Patent No.: US 6,816,562 B2
(45) Date of Patent: Nov. 9, 2004

(54) SILICON OBJECT ARRAY WITH UNIDIRECTIONAL SEGMENTED BUS ARCHITECTURE

(75) Inventors: Kevin E. Atkinson, Eden Prairie, MN (US); Timothy H. Dwyer, Minneapolis, MN (US); Ryan C. Johnson, Waconia, MN (US); Mark D. Elpers, Elk River, MN (US); Dirk R. Helgemo, Shakopee, MN (US)

(73) Assignee: MathStar, Inc., Minneapolis, MN (US)

( * ) Notice: Subject to any disclaimer, the term of this patent is extended or adjusted under 35 U.S.C. 154(b) by 111 days.

(21) Appl. No.: 10/337,494

(22) Filed: Jan. 7, 2003

(65) Prior Publication Data

US 2004/0130346 A1 Jul. 8, 2004

(51) Int. Cl.[7] .................................... H03K 19/177
(52) U.S. Cl. ........................ 376/39; 376/41; 376/47
(58) Field of Search .............................. 326/37–41, 47

(56) References Cited

U.S. PATENT DOCUMENTS

| | | | |
|---|---|---|---|
| 6,121,790 A | 9/2000 | Lee et al. | 326/39 |
| 6,127,846 A | 10/2000 | McClintock et al. | 326/41 |
| 6,181,160 B1 | 1/2001 | Lee | 326/39 |
| 6,181,162 B1 | 1/2001 | Lytle et al. | 326/41 |
| 6,184,710 B1 | 2/2001 | Mendel | 326/41 |
| 6,218,856 B1 | 4/2001 | Sasaki | 326/39 |
| 6,225,822 B1 | 5/2001 | Lane et al. | 326/41 |
| 6,239,615 B1 | 5/2001 | Ngai et al. | 326/41 |
| 6,262,595 B1 | 7/2001 | Huang et al. | 326/41 |
| 6,281,704 B2 | 8/2001 | Ngai et al. | 326/41 |
| 6,369,610 B1 * | 4/2002 | Cheung et al. | 326/41 |
| 6,417,694 B1 | 7/2002 | Reddy et al. | 326/41 |

* cited by examiner

*Primary Examiner*—Anh Q. Tran
(74) *Attorney, Agent, or Firm*—Westman, Champlin & Kelly (57) ABSTRACT

A logic array is provided, which includes a plurality of unidirectional segmented buses connecting a plurality of processing elements, called silicon objects, within an integrated circuit. The bus includes a string of unidirectional bus segments. Each silicon object includes a bus input coupled to one of the bus segments in the first bus, and a bus output coupled to a next subsequent one of the bus segments in the first bus. A landing circuit is coupled to the bus input for receiving digital information from the bus input. A function-specific logic block is coupled to an output of the landing circuit and has a result output. Each silicon object further includes a multiplexer having first and second inputs coupled to the bus input and the result output, respectively, and having an output coupled to the bus output.

31 Claims, 6 Drawing Sheets

SILICON OBJECT ARRAY WITH UNIDIRECTIONAL SEGMENTED BUS ARCHITECTURE

FIELD OF THE INVENTION

The present invention relates to semiconductor integrated circuits. More particularly, the present invention relates to an architecture for communicating between a plurality of processing elements, called silicon objects, within an integrated circuit.

BACKGROUND OF THE INVENTION

As transistor density in integrated circuits continues to increase, the resulting increase in processing potential is often limited due to prohibitively high development complexity, time, and cost. While traditional microprocessors and Field Programmable Gate Array (FPGA) based designs avoid high non-recurring engineering expenses, an overall lack of performance and efficiency leads to a large area and hence high per-chip cost. In certain applications, such as multi-gigabit line rate communication processing, performance constraints render these solutions unworkable.

In these types of applications, it is convenient for integrated circuit designs to have a high degree of configurability and programmability to allow the same integrated circuit design to perform a variety of different logical functions. For example, integrated circuits have been designed with a plurality of individual, programmable processing elements, which are arranged to form an array. Each processing element can be implemented to use dedicated, "nearest-neighbor" connections to allow that processing element to communicate with the eight nearest neighbors in the array. The eight nearest neighbors are located to the north, south, east, west, northwest, northeast, southwest, and southeast of the processing element.

Although this arrangement provides a basic level of configurability, the programmability of each processing element has been limited and it is difficult for one processing element to communicate with other processing elements that are not nearest neighbors.

Improved configurable architectures are therefore desired that provide increased flexibility in communicating from one processing element to other elements in the array and increased programmability of the logic function performed by each processing element.

SUMMARY OF THE INVENTION

One embodiment of the present invention is directed to a logic array, which includes a unidirectional segmented bus and a plurality of silicon objects. The bus includes a string of unidirectional bus segments. Each silicon object includes a bus input coupled to one of the bus segments in the first bus, and a bus output coupled to a next subsequent one of the bus segments in the first bus. A landing circuit is coupled to the bus input for receiving digital information from the bus input. A function-specific logic block is coupled to an output of the landing circuit and has a result output. Each silicon object further includes a multiplexer having first and second inputs coupled to the bus input and the result output, respectively, and having an output coupled to the bus output.

Another embodiment of the present invention is directed to a logic array, which includes first and second unidirectional segmented buses. Each bus includes a string of unidirectional bus segments. First and second sets of silicon objects, including at least one common silicon object, are coupled between segments in the first and second buses, respectively. The common silicon object includes first and second bus inputs coupled to respective bus segments in the first and second buses, respectively, and first and second bus outputs coupled to subsequent bus segments in the first and second buses, respectively. A logic circuit is coupled to receive a first digital value from the first bus input and generates a new digital value. A launch circuit selectively passes the first digital value from the first bus input to the first bus output, replaces the first digital value with the new digital value on the first bus output, or passes the first digital value to the second bus output.

Yet another embodiment of the present invention is directed to a method of communicating digital values between silicon objects on an integrated circuit. The method includes: coupling a first set of silicon objects between respective unidirectional bus segments in a first unidirectional segmented bus; coupling a second set of silicon objects between respective bus segments in a second unidirectional segmented bus, wherein at least one of the silicon objects is common to the first and second sets; receiving a first digital value within the common silicon object from one of the bus segments in the first bus first; generating a new digital value within the silicon object; selectively passing the first digital value from the common silicon object to another of the bus segments in the first bus; selectively replacing the first digital value with the new digital value within the common silicon object and passing the new digital value from the common silicon object to the other bus segment in the first bus; and selectively passing the first digital value from the common silicon object to one of the bus segments in the second bus.

DETAILED DESCRIPTION OF THE PREFERRED EMBODIMENTS

Figures 1, 1A:
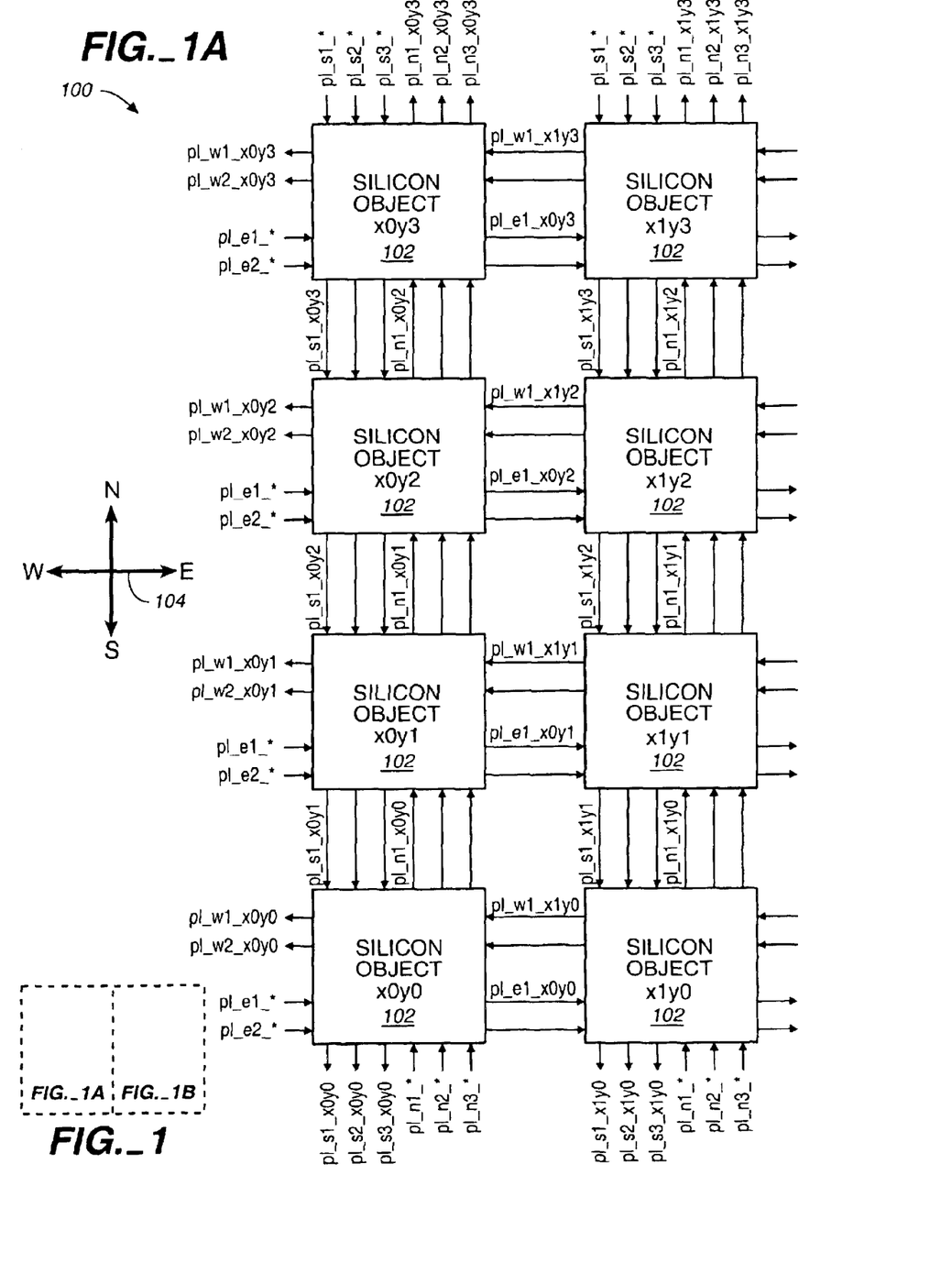
FIG. 1 is a diagram illustrating a reconfigurable logic array of silicon objects having ten instances of unidirectional segmented buses, called "party lines", according to one embodiment of the present invention.
Figure 1B:
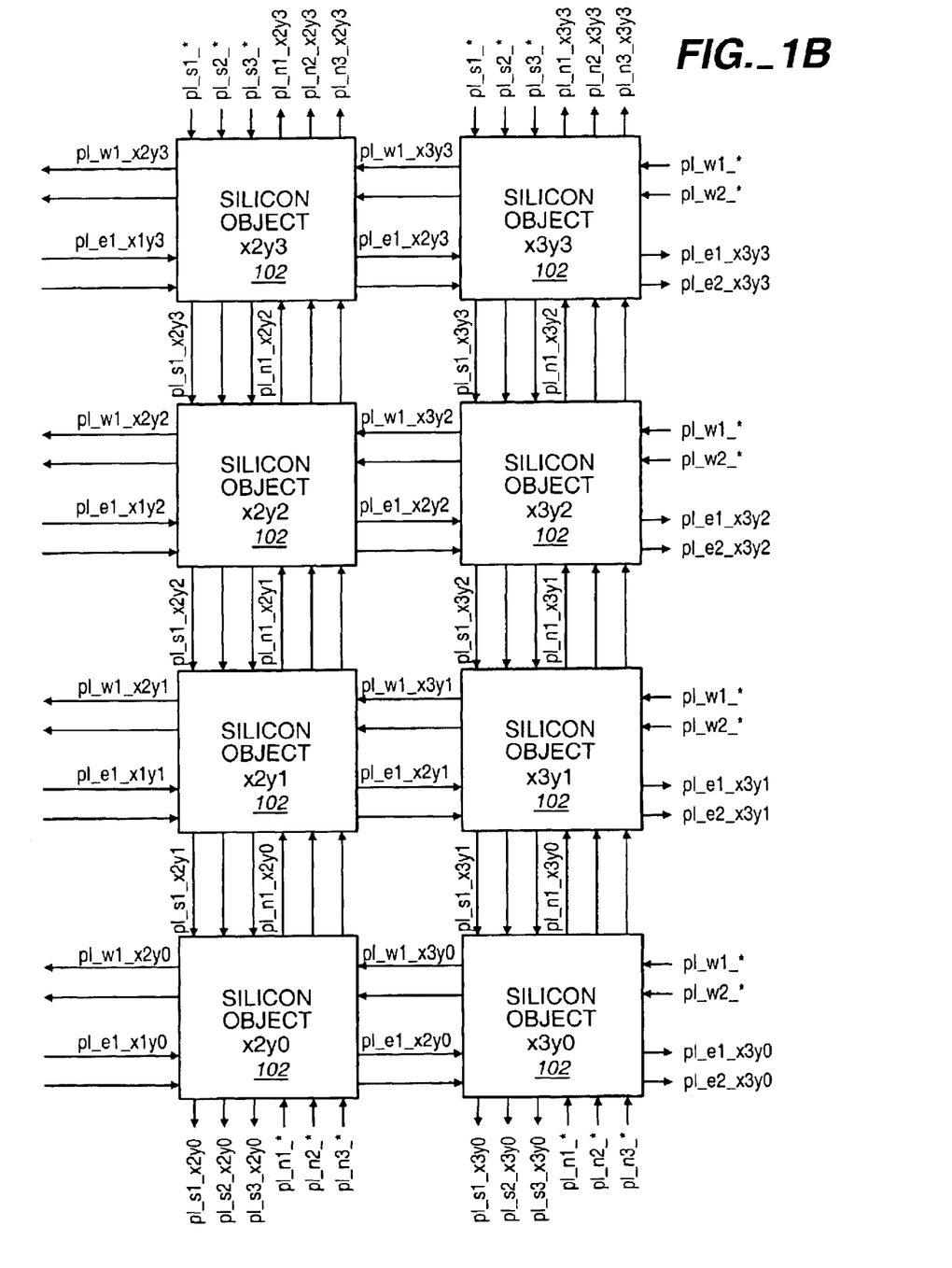

FIG. 1 is a diagram illustrating a reconfigurable logic array 100 of silicon objects 102 connected by "party lines" according to one embodiment of the present invention. Silicon objects 102 are arranged to form a two-dimensional, four-by-four element array. Any number of silicon objects can be used in alternative embodiments of the present invention, and the array can have any number of dimensions. Also, the array can be non-orthogonal.

A "silicon object" is a single processing element. Any type of silicon object can be used, and these silicon objects can communicate with one another to provide a composite, multi-object function. For example, silicon objects 102 can include function-specific logic blocks such as an arithmetic logic unit (ALU), a content-addressable memory (CAM), a cyclic redundancy check (CRC) generator, an integer/real/ complex multiplier, a Galois Field multiplier, a memory, or any other combinational or sequential logic function. Also, each silicon object can be programmable in nature, if desired.

In one embodiment, each silicon object 102 has the same physical structure, which is multiply instantiated to form array 100. Each instantiation is independently configurable. In alternative embodiments, each silicon object is not required to have the same structure as any of the other silicon objects.

The following naming conventions are used throughout the various figures. Referring to FIG. 1, coordinates are expressed as "x#y#" using a minimum number of digits, where an x represents location in the east and west directions, y represents location in the north and south directions and # represents a particular value. The north, south, east, and west directions are indicated by arrows 104. For example, the silicon object 102 that is located in the lower left corner of array 100 is labeled "x0y0", and the silicon object that is located in the upper right corner is labeled "x3y3". The remaining silicon objects 102 are similarly numbered to indicate their relative positions within array 100.

Signals are named by the coordinates of the silicon object that drives them. Signals that are driven from outside array 100 are suffixed with "_*" in FIG. 1. For example, silicon object x0y0 receives a signal, pl_e1_*, from outside array 100. Silicon object x0y0 drives a signal, pl_e1_x0y0, to silicon object x1y0 and receives a signal, pl_w1_x1y0, from silicon object x1y0. In subsequent figures, interface pins of each silicon object 102 is owned by that object and therefore uses a relative/directional name and is suffixed with "_in" or "_out" to designate an input or an output, respectively.

Referring to the data flow paths shown in FIG. 1, silicon objects 102 are connected together by a plurality of "party lines" running in orthogonal north, south, east and west directions, as indicated by arrows 104. Party lines are unidirectional segmented buses that communicate in vertical and horizontal (Manhattan) directions. A bus is "segmented" in that the bus passes through at least some combinational logic and/or a register from one bus segment to the next. In the vertical direction, three party lines go northward (and contain the notations N1, N2 and N3); and three go southward (S1, S2 and S3). Horizontally, two party lines go eastward (E1 and E2); and two go westward (W1 and W2). Each bus segment is not required to connect proximal silicon objects. For example in one alternative embodiment, a bus segment might connect to only every other silicon object through which it passes. Also, the party lines can extend through logic array 100 in any parallel (potentially opposite) or orthogonal direction relative to one another. In another embodiment, one or more party lines extend through logic array 100 such that the silicon objects pack as octagons (i.e., party line intersection angles are multiples of 45 degrees) or as hexagons (i.e., party line intersection angles are multiples of 60 degrees) within logic array 100.

In one embodiment, each party line includes four control bits (C[3:0]), a valid bit (V) and a sixteen-bit data word (R[15:0]), for a total of 21 bits. Each party line is formed by a string of bus segments. Each bus segment extends from one silicon object 102 to the next silicon object 102 along that same party line (segmented bus). For example, one party line is formed by eastwardly extending bus segments pl_e1_*, pl_e1_x0y0, pl_e1_x1y0, pl_e1_x2y0 and pl_e1_x3y0. The "e1" designation in these bus segments indicates a first eastward-extending party line. A second eastward party line is indicated by the notation "e2". The same notation is used for the remaining party lines. Each silicon object 102 is connected to ten party lines formed by ten different unidirectional segmented buses.

In the following figures, control and data often follow the same paths and are therefore labeled together as a 21-bit bus. Each signal type of a bus is labeled with the indicator "c", "v", or "r", depending on whether the bus contains control, valid, or data bits. In the case of multiple types of content in a bus, the type indicators are concatenated (e.g., "cvr").

Figure 2:
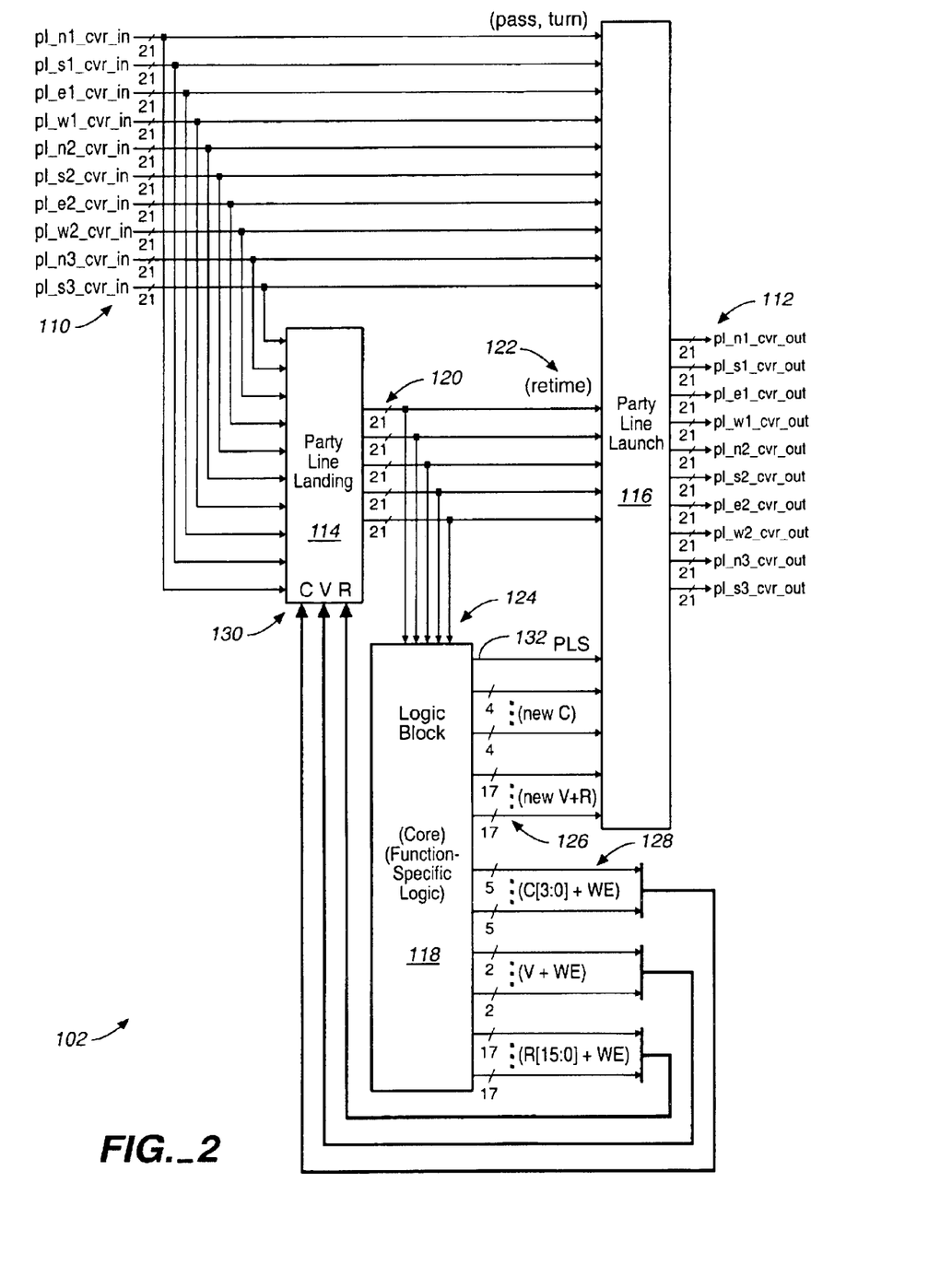
FIG. 2 is a block diagram illustrating in greater detail one of the silicon objects shown in FIG. 1, according to one embodiment of the present invention.

FIG. 2 is a block diagram illustrating in greater detail one of the silicon objects 102. Silicon object 102 has ten party line inputs 110, ten party line outputs 112, a party line landing circuit 114, a party line launch circuit 114, and a function-specific logic block ("core") 118. Party line inputs 110 and outputs 112 are each 21-bits wide and include control bits C[3:0], data bits R[15:0] and valid bit V. Therefore, each of the inputs 110 and outputs 112 has the "cvr" notation mentioned above.

Each of the party line inputs 110 is coupled to party line landing circuit 114 and to party line launch circuit 116. In one embodiment, party line landing circuit 114 includes one or more registers for receiving digital values (data, valid and/or control) from one or more of the party line inputs 110. In one embodiment, party line landing circuit 114 has five landing registers. Each landing register can be selectively used to store values from one of two corresponding party line inputs 110. These landing registers have outputs 120, which are coupled to logic block 118 and to inputs 122 of launch circuit 116.

Values on party line inputs 110 can therefore be captured by a landing register for use by logic block 118 or for synchronizing the value with a local clock signal and transmitting the value back onto the same or a different party line through launch circuit 116.

As mentioned above, logic block 118 can have any logic function and configuration that is suitable for the particular application in which the array is used. Logic block 118 receives landing register outputs 120 on inputs 124, processes the information according to its function, and generates one or more results on result outputs 126 and 128.

Result outputs 126 are coupled to launch circuit 116. Result outputs 126 include one or more sets of new data and valid bits (new R[15:0] and V) and one or more sets of new control bits (new C[3:0]). Any number of result outputs 126 can be generated. In one embodiment, there are four new data values (R[15:0] and V) of 17 bits each and four new control values (C[3:0]) of one bit each. In addition, logic block 118 provides a party line select signal 132, called PLS, which assists in selecting the configuration in which the inputs to launch circuit 116 are routed to party line outputs 112. For example, launch circuit 116 can be configured to selectively "pass" a value received from the previous silicon object on one party line to the next segment of the party line on output 112, "turn" the value from the previous silicon object to a different party line on output 112, or replace the value with a new value from logic block 118 or landing circuit 114, which can then be transmitted to one of the party line outputs 112. The reconfigurability of launch circuit 116 is described in more detail with reference to FIGS. 4 and 5.

Result outputs 128 are fed back to inputs 130 of landing register 114 so that the landing registers can optionally be configured for use as working registers for logic block 118. In one embodiment, result outputs 128 include five sets of 16-bit data (R[15:0]) and five sets of valid bits (V), each corresponding to a party line landing register. Each instance of each type of signal, control (C), valid (V), and data (R), has its own write enable (core_ ... _we in FIG. 3). If the corresponding write enable signal is inactive, the corresponding landing register retains its value from the previous clock cycle.

Figure 3:
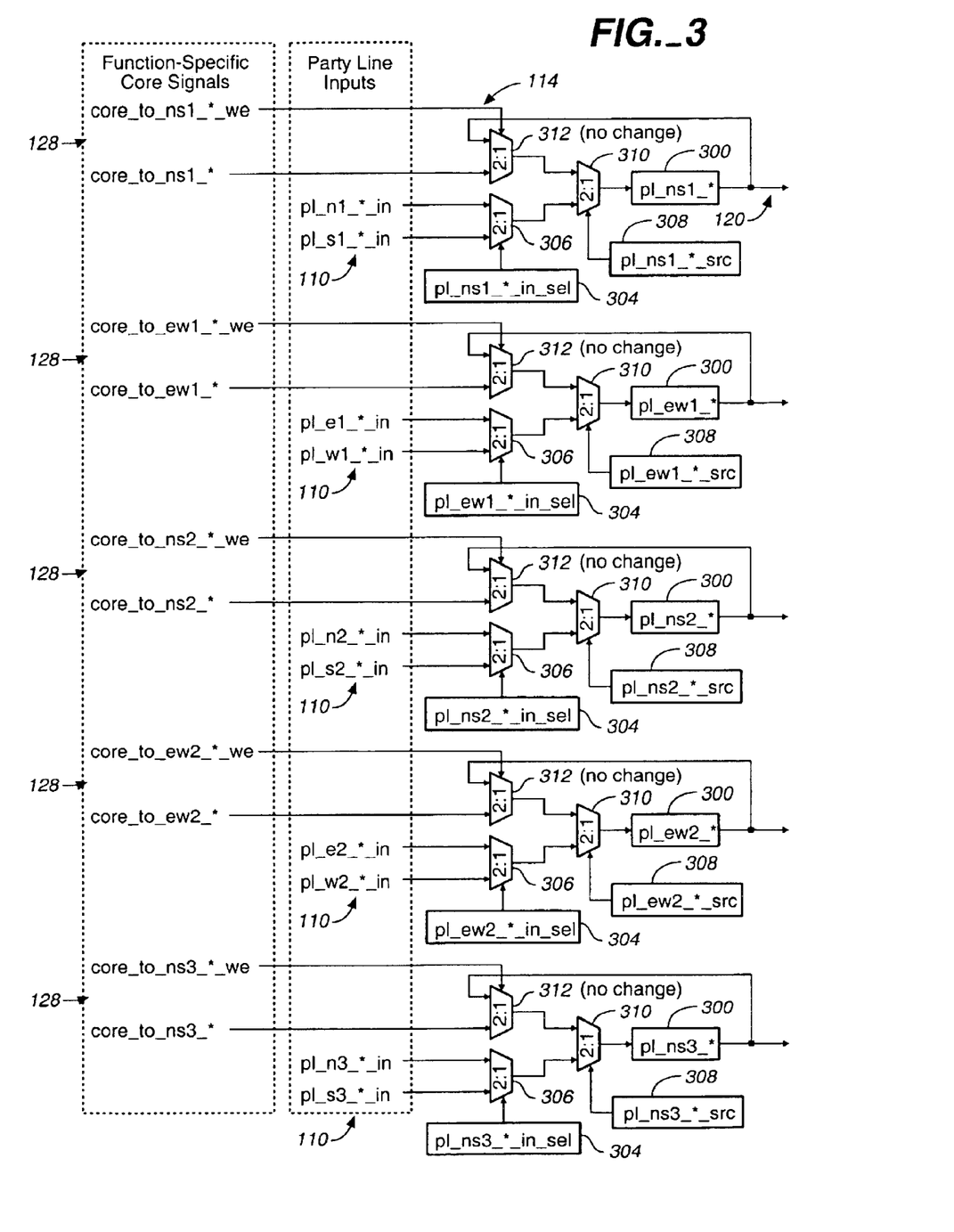
FIG. 3 is a block diagram illustrating a party line landing circuit within the silicon object shown in FIG. 2, according to one embodiment of the present invention.

FIG. 3 is a block diagram illustrating party line landing circuit 114 in greater detail. Sampling of the data bits (R[15:0]), the valid bits (V), and the control bits (C[3:0]) are independently controlled through similar logic. For simplicity, FIG. 3 shows the landing registers and control circuitry for capturing one of the independently configurable fields. The block diagram shown in FIG. 3 is therefore instantiated once for each of these three fields. For each instantiation, the asterisk (*) in each signal or component name is replaced with "r" for the data (R[15:0]), "v" for the valid bits (V), or "c" for the control bits (C[3:0]). For example, the party line signal "pl_n1_*_in" corresponds to a 16-bit signal "pl_n1_r_in" for the data bits (R[15:0]), a 1-bit signal "pl_n1_v_in" for the valid bit (V), and a 4-bit signal "pl_n1_c_in" for the control field (C bits).

Landing circuit 114 receives the ten party line inputs 110 and the five data field (R+V) result outputs 128 (labeled "core_ ... _*") together with corresponding write enables (labeled "core_ ... _*_we"). In one embodiment, no control bit results are passed, so the corresponding write enable control ("core_ ... _c_we") is always inactive.

There are five landing registers 300 for capturing values from the ten party lines 110 and the five data result outputs 128. There is one result output 128 for the first north and south party lines (N1 and S1), the first east and west party lines (E1 and W1), the second north and south party lines (N2 and S2), the second east and west party lines (E2 and W2), and the third north and south party lines (N3 and S3).

Each register 300 can capture values from one of two party lines 110 or one of the result outputs 128. For example, landing register pl_ns1_* can capture values from party line inputs pl_n1_*_in and pl_s1_*_in, or from data result output core_to_ns1_*_in. The choice between the two party lines is directed by configuration bit 304 and effected by 2-to-1 multiplexer 306. When configuration bit 304 is high, multiplexer 306 selects pl_s1_*_in. When configuration bit 304 is low, multiplexer 306 selects pl_n1_*_in. The output of multiplexer 306 is coupled to landing register 300 through multiplexer 310. Table 1 shows which party lines 110 can land in which landing register 300.

TABLE 1

| LANDING REGISTER | CONFIGURATION BITS | PARTY LINE (CONFIG BIT LOW) | PARTY LINE (CONFIG BIT HIGH) |
|---|---|---|---|
| pl_ns1_vr | pl_ns1_vr_in_sel* | N1 | S1 |
| pl_ns1_c[3:0] | pl_ns1_c_in_sel*[3:0] | | |
| pl_ew1_vr | pl_ew1_vr_in_sel* | E1 | W1 |
| pl_ew1_c[3:0] | pl_ew1_c_in_sel*[3:0] | | |
| pl_ns2_vr | pl_ns2_vr_in_sel* | N2 | S2 |
| pl_ns2_c[3:0] | pl_ns2_c_in_sel*[3:0] | | |
| pl_ew2_vr | pl_ew2_vr_in_sel* | E2 | W2 |
| pl_ew2_c[3:0] | pl_ew2_c_in_sel*[3:0] | | |
| pl_ns3_vr | pl_ns3_vr_in_sel* | N3 | S3 |
| pl_ns3_c[3:0] | pl_ns3_c_in_sel*[3:0] | | |

The selection between the two party lines 110 and the result output 128 is made with configuration bit 308 and multiplexer 310. Configuration bit 308 is coupled to the select input of multiplexer 310. One input of multiplexer 310 is coupled to the output of multiplexer 306, and the other input is coupled to the output of multiplexer 312.

When configuration bit 308 is high, multiplexer 310 applies the selected party line input 110 to register 300. When configuration bit 308 is low, multiplexer 310 applies the output of multiplexer 312 to register 300.

Multiplexer 312 allows the previous value of result output 128 to be held within register 300 during the present clock cycle when configuration bits 308 are configured to store the results from logic block 118. Multiplexer 312 has a first input coupled to the output of register 300 and a second input coupled to the corresponding result output 128. Write enables (core_to_ns1_*_we, core_to_ew1_*_we, core_to_ns2_*_we, core_to_ew2_*_we, and core_to_ns3_*_we) select whether the previous values are fed back to registers 300 through multiplexers 312 or new values are captured from result outputs 128. The write enables correspond to the write enable signals "WE" shown on result outputs 128 in FIG. 2. There is one write enable bit for each of the five data result outputs 128, and there are separate sets of write enable bits for the data bits (R[15:0]) and valid bits (V). Each write enable bit is coupled to the select input of a corresponding one of the multiplexers 312.

In one embodiment, logic block 118 does not provide C bit result outputs 128 for the party line registers 114. Thus the configuration of register 308 for these C bits is understood to be high (to select party line input), the behavior of multiplexer 310 is understood to always select the value from multiplexer 306, and the result of multiplexer 312 is thereby irrelevant. Implementation resources are conserved by connecting multiplexer 306 directly to register 300 (optimizing-away elements 308, 310, and 312) since the behavior of the intermediate logic is known prior to fabrication.

Figure 4:
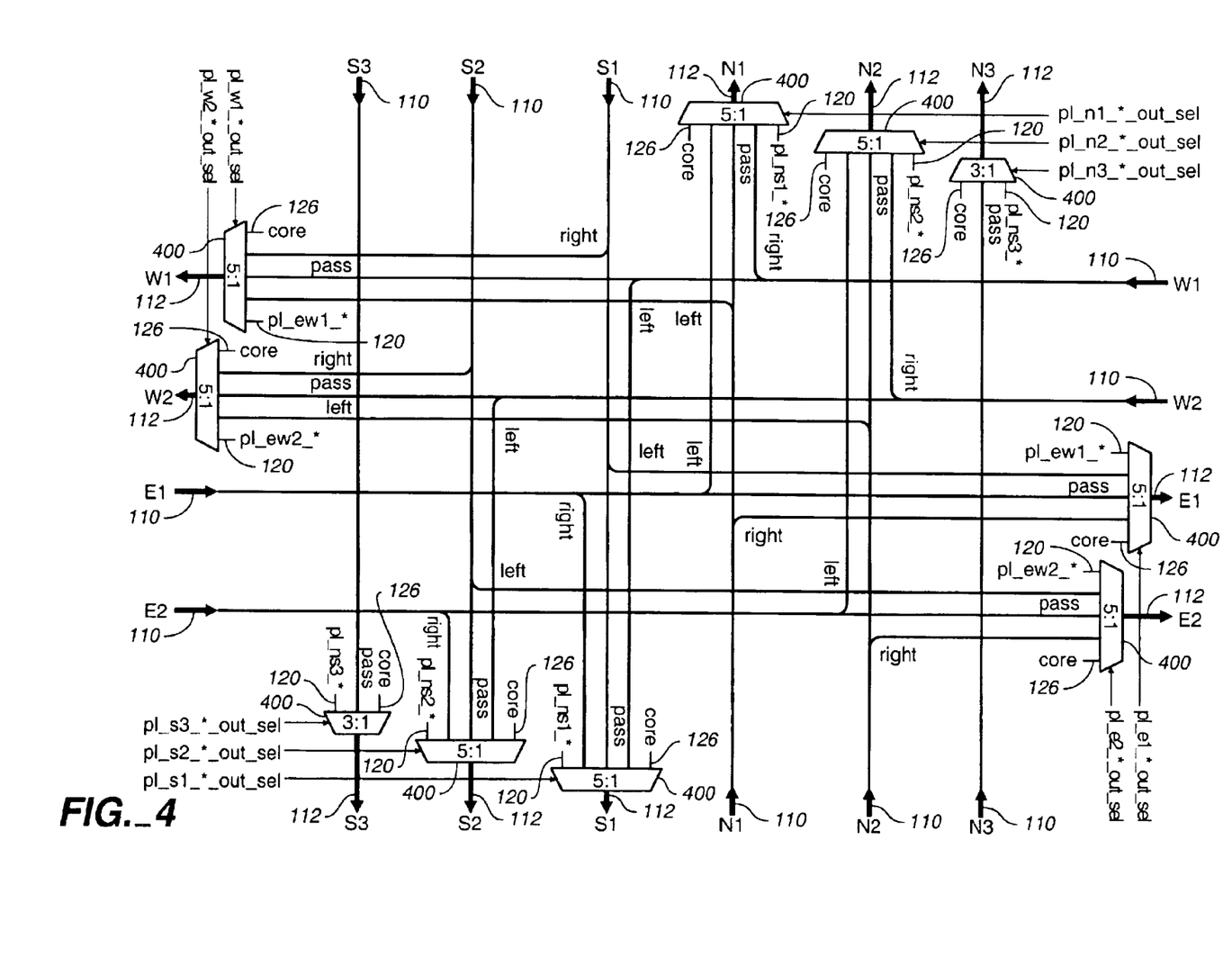
FIG. 4 is a block diagram illustrating a party line launch circuit within the silicon object shown in FIG. 2, according to one embodiment of the present invention.

FIG. 4 is a schematic diagram illustrating launch circuit 116 (shown in FIG. 2) in greater detail. Again, only a portion of the data path through launch circuit 116 is shown for simplicity. The portion shown in FIG. 4 is instantiated five times, once for the data field (R[15:0] and V) and once for each of the four control bits (C[3:0]). In each instantiation, the asterisk (*) in each signal name is replaced with "vr" for the data field or "c" for each bit of the control field. Control bits are further specified by identifying the bit position, such as "c[0]".

Each of the ten party line outputs 112 (labeled N1, N2, N3, S1, S2, S3, E1, E2, W1, and W2) is driven by a respective multiplexer 400. Multiplexers 400 allow the data paths through the silicon object to be configured for launching values from a variety of sources. These values include the result outputs 126 (labeled "core") from logic block 118, the party line landing register outputs 120 (labeled pl_ns1_*, pl_ns2_*, pl_ns3_*, pl_ew1_*, and pl_ew2_*), the value received on the corresponding party line input 110 (passing straight through the silicon object to the subsequent segment of the corresponding unidirectional segmented bus, labeled as party line output 112), the value received on a party line extending in a direction −90 degrees relative to the corresponding input 110 (turning left from north-to-west, west-to-south, south-to-east, and east-to-north), and the value received on a party line extending in a direction +90 degrees relative to the corresponding input 110 (turning right from north-to-east, east-to-south, south-to-west, and west-to-north). In this embodiment, party lines N3 and S3 (coupled via party line inputs 110 pl_n3_*_in and pl_s3_

*_in, and via party line outputs 112 pl_n3_*_out and pl_s3_*_out) do not have any turning capability.

For example, the multiplexer 400 that is coupled to party line output 112 for party line N1 has a first input coupled to output 120 of party line landing register pl_ns1_*, a second input coupled to party line input W1 (turning right), a third input coupled to party line input N1 (passing straight through), a fourth input coupled to party line input E1 (turning left), and a fifth input coupled to result output 126 (labeled "core") from logic block 118 (shown in FIG. 2). The result outputs 126 can be specific to a particular party line or common to one or more other party lines.

Each multiplexer input includes the corresponding fields (R[15:0]+V, C[3], C[2], C[1], or C[0]) of the instance of the launch structure. The remaining launch multiplexers 400 are coupled in a similar fashion to provide similar routing selections. However, the launch multiplexers 400 for party line outputs N3 and S3 are 3-to-1 multiplexers instead of 5-to-1 multiplexers since these party lines do not have corresponding lines in the eastward and westward directions, that is, they cannot turn.

Each launch multiplexer 400 has a select input coupled to a corresponding select signal, pl_n1_*_out_sel, pl_n2_*_out_sel, pl_n3_*_out _sel, pl_s1_*_out_sel, pl_s2_*_out_sel, pl_s3_*_out_sel, pl_e1_*_out_sel, pl_e2_*_out_sel, pl_w1_*_out_sel, or pl_w2_*_out_sel. There is one launch select signal for each launch multiplexer 400 in each instance of the launch structure. With ten instances of five multiplexers, there are a total of 50 select signals. These select signals are generated by a launch selection control circuit based on the data stored in configuration registers maintained within each silicon object 102 and by control bits received into the party line landing registers 300.

The routing configurations and options shown in FIG. 4 are provided as examples only. Various routing configurations and options can be added or removed in alternative embodiments of the present invention.

Figure 5:
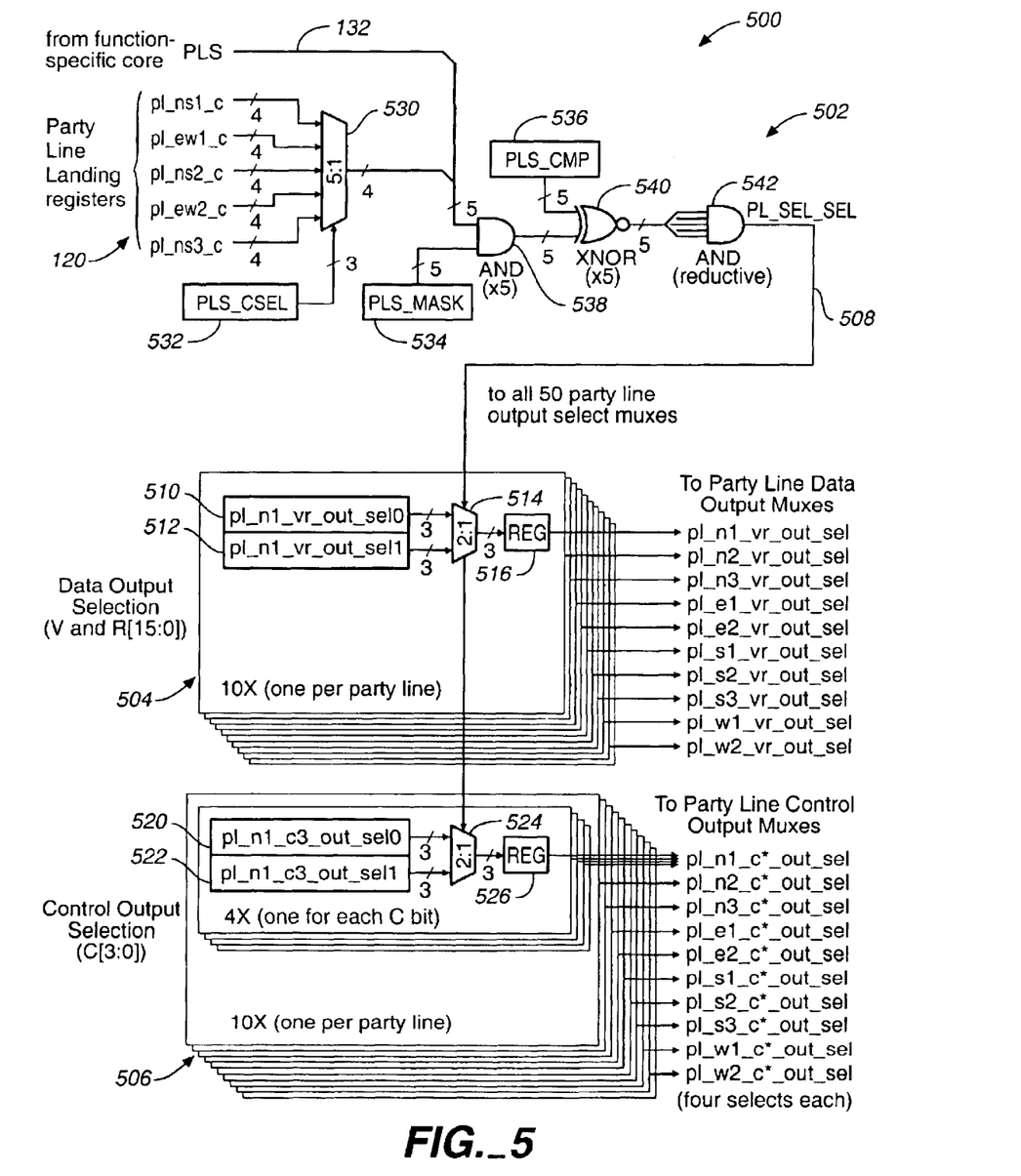
FIG. 5 is a block diagram illustrating a launch selection control circuit used for configuring the launch circuit shown in FIG. 4, according to one embodiment of the present invention.

FIG. 5 is block diagram illustrating a launch selection circuit for generating the launch selection signals according to one embodiment of the present invention. In this embodiment, each launch multiplexer 400 is dynamically operated in one of two static configurations. That is, one of these two configurations is chosen for all party lines on a per-clock basis. Any number of selectable configurations can be used in alternative embodiments, and these configurations can be static or dynamic.

Launch selection circuit 500 includes configuration control circuit 502, data output select circuit 504, and control output select circuit 506. Configuration control circuit 502 generates a party line select control signal PL_SEL_SEL on output 508, which selects one of the two configuration options for all fields of all party lines.

The V and R [15:0] bits of each party line are routed as a unit by the select signals generated by data output select circuit 504. The four control bits C[3:0] of each party line are routed individually for each party line by the select signals generated by control output select circuit 506. Thus, five select signals are generated for each party line: one for each of the four C[3:0] bits (e.g., pl_n1_c_out_sel[0]), and one for the V and R[15:0] bits (e.g., pl_n1_vr_out_sel). Each select signal can have one of two selectable patterns, based on the logic state of PL_SEL_SEL on output 508.

In data output select circuit 504 the select signal for the V and R[15:0] bits of each party line is generated by data launch configuration registers 510 and 512, multiplexer 514 and register 516. Configuration registers 510 and 512 store the binary patterns for the two selectable configurations for that party line. Multiplexer 514 selects which pattern is used for driving the select inputs of multiplexers 400 shown in FIG. 4 for the data fields. This selection is made as a function of configuration control output 508. The selected pattern is stored in register 516 for the current clock cycle.

Similarly, control output select circuit 506 includes configuration registers 520 and 522, multiplexer 524 and register 526 for each control bit C[3:0] of each party line. Again, configuration registers 520 and 522 store the binary patterns for the two selectable configurations for the corresponding control bit. Multiplexer 524 selects which pattern is applied to register 526 for each clock cycle as a function of configuration control output 508.

Configuration control circuit 502 includes 5-to-1 multiplexer 530, party line control bit select register 532, party line select mask register 534, party line select compare register 536, logic AND gates 538 (array of five gates), exclusive-NOR (XNOR) gates 540 (array of five gates) and reductive logic AND gate 542.

The control fields (C[3:0]) of the landing registers 300 (FIG. 3) can be used to store patterns that determine which configuration mode will be selected. Landing register outputs 120 are coupled to respective inputs of multiplexer 530. The select input of multiplexer 530 is coupled to control register 532. Register 532 is loaded with a value that selects the appropriate landing register output 120 for matching the desired pattern.

In addition, the party line select (PLS) bit 132 is supplied from logic block 118 (shown in FIG. 2). PLS bit 132 and the selected landing register output (four control bits) are applied to respective inputs of respective AND gates 538. The other inputs of AND gates 538 are coupled to mask register 534.

Mask register 534 is loaded with a pattern that can be used to mask-out certain bits in the pattern formed by PLS bit 132 and the four control bits of the selected landing register. The five-bit masked pattern at the output of AND gate 538 is applied to one set of inputs of XNOR gates 540. The other set of inputs of XNOR gates 540 are coupled to compare register 536. Compare register 536 is loaded with a five-bit pattern for comparing against the masked output of AND gates 538. The XNOR gates 540 perform a bit-wise comparison and generate a five-bit output, which indicates whether each bit location had a match.

The five-bit output from XNOR gate 540 is applied to the five-bit reductive AND gate 542. If each bit of the masked output from AND gate 538 matches the corresponding bit in compare register 536, all inputs to AND gate 542 will be high resulting in a high value on configuration control output 508. If there is a mismatch in one or more of the bit locations, output 508 will be low.

Thus, the results from an operation in logic block 118 or a value from one of the party lines can be loaded into a landing register and compared against the match pattern to determine which routing configuration through multiplexers 400 (shown in FIG. 4) will be used during the next clock cycle. Also, logic block 118 can directly control the operating mode by setting or clearing PLS bit 132.

Configuration registers 510, 512, 520 and 522 and registers 532, 534 and 536 can be hard-wired, programmed through scan logic on power-up, or written through party line inputs 110 and landing register circuit 114, for example. Configuration control circuit 502 therefore provides a high level of programmability to the routing options through launch circuit 116, and these options can be reconfigured on each clock cycle, if desired. Each party line can be configured independently of the other party lines, and the data can be routed independently of the control bits.

Configuration control circuit 502 is one example of a control circuit that can be used for selecting different routing options through launch circuit 116. Numerous other routing options and control circuits can be used in alternative embodiments.

As integrated circuit geometries shrink and design and mask-set costs rise, off-the-shelf, high performance, reconfigurable devices become more desirable. A reconfigurable logic array, such as that shown in FIGS. 1–5, can provide the time to market advantages of Field Programmable Gate Arrays (FPGAs) with the cost and performance advantages of custom Application Specific Integrated Circuits (ASICs).

A reconfigurable logic array can also allow changes to be made to the logical function and data paths through software upgrades, which allows vendors to begin designing an integrated circuit before the specifications of the circuit are finalized. The data paths and control paths are loosely coupled, yet independently configurable. In one embodiment, the data path is sixteen bits wide while the control path is bit-wide granular. Each silicon object can have its own local structure, program, and/or memory. Further, each processing element can operate on its own without requiring global control.

Communication between silicon objects can be performed through traditional nearest-neighbor connections and through party lines that provide longer distance communication. Silicon objects are allowed to change communication patterns on a per-clock basis, for example. In one embodiment, the function-specific logic block of each silicon object has a program memory that includes both operation and communication directions. The instructions can be loaded during initial configuration or dynamically during operation. Intelligent compilation (scheduling and routing) tools can be used to deterministically allocate instructions to each object before run time.

The control paths can guide program execution while data is moved and operated upon through the data paths. From this view, instructions are the mechanisms that tie the independent control and data paths together within an array.

Reconfigurable logic arrays can be used in a wide variety of applications. For example, the arrays can be used to provide high-throughput data processing in applications that exhibit high levels of data flow determinism (i.e., regular dependencies) at a localized level. Irregular dependencies (e.g., interrupts and context switches) can be handled as ordinary signals. Reconfigurable arrays can be used for multi-gigabit communications processing, such as data link layer processing, TCP/IP processing, and security processing. At the functional level, these applications can require frame/packet parsing and generation, finite state machines, CRC generation and detection, comma detection, statistics counters, hashing and memory controllers, for example. These arrays can also be used for signal processing applications such as image and video compression, wireless local area networks, and Forward Error Correction. Numerous other applications also exist.

Although the present invention has been described with reference to preferred embodiments, workers skilled in the art will recognize that changes may be made in form and detail without departing from the spirit and scope of the invention. For example, the terms "high" and "low" are arbitrary terms and are interchangeable with a logical inversion of the circuit. Likewise, the term "coupled" can include various types of connections or couplings and can include a direct connection or a connection thorough one or more intermediate components.

What is claimed is:

1. A logic array comprising:
    a first unidirectional segmented bus comprising a string of unidirectional bus segments; and
    a first plurality of silicon objects, wherein each silicon object comprises:
        a first bus input coupled to one of the bus segments in the first bus;
        a first bus output coupled to a next subsequent one of the bus segments in the first bus;
        a landing circuit coupled to the first bus input for receiving digital information from the first bus input;
        a function-specific logic block coupled to an output of the landing circuit and having a result output; and
        a first multiplexer having first and second multiplexer inputs coupled to the first bus input and the result output, respectively, and having a multiplexer output coupled to the first bus output.

2. The logic array of claim 1 wherein the first multiplexer further comprises a third multiplexer input coupled to the output of the landing circuit.

3. The logic array of claim 1 wherein the landing circuit comprises a landing register for storing the digital information.

4. The logic array of claim 3 wherein the function-specific logic block comprises a further result output and the landing circuit comprises:
    a landing multiplexer, which multiplexes the first bus input and the further result output to the landing register.

5. The logic array of claim 1 wherein the first bus input and the result output each has a data field and a control field.

6. The logic array of claim 5 wherein the first multiplexer multiplexes the data fields of the first bus input and the result output independently of the control fields.

7. The logic array of claim 6 wherein the control fields of the first bus input and the result output each includes multiple bits and the first multiplexer multiplexes each bit of the control fields independently of the other bits.

8. The logic array of claim 1 and further comprising:
    a second unidirectional segmented bus, which extends along the logic array in a common direction with the first bus and comprises a string of bus segments that interconnect the first plurality of silicon objects; and
    wherein each of the first plurality of silicon objects further comprises:
        a second bus input coupled to one of the bus segments in the second bus;
        a second bus output coupled to a next subsequent one of the bus segments in the second bus;
        a second result output from the function-specific logic block; and
        a second multiplexer having first and second multiplexer inputs coupled to the second bus input and the second result output, respectively, and having a multiplexer output coupled to the second bus output.

9. The logic array of claim 1 and further comprising:
    a second unidirectional segmented bus, which extends along the logic array in a different direction than the first bus, wherein the second bus comprises a respective string of unidirectional bus segments; and a second plurality of silicon objects, including
at least one common one of the first plurality of silicon objects, wherein the common silicon object further comprises:
a second bus input coupled to one of the bus segments in the second bus;
a second bus output coupled to a next subsequent one of the bus segments in the second bus;
a second result output from the function-specific logic block; and
a second multiplexer having first and second multiplexer inputs coupled to the second bus input and the second result output, respectively, and having a multiplexer output coupled to the second bus output.

10. The logic array of claim 1 wherein at least one of the first plurality of silicon objects is not adjacent to the next subsequent one of the first plurality of silicon objects along the first bus, within the array.

11. The logic array of claim 9 wherein:
the first multiplexer comprises a third multiplexer input coupled to the second bus input; and
the second multiplexer comprises a third multiplexer input coupled to the first bus input.

12. The logic array of claim 9 wherein the landing circuit comprises:
a landing register; and
a landing multiplexer, which multiplexes the first and second bus inputs to the landing register.

13. A logic array comprising:
first and second unidirectional segmented buses, each bus comprising a string of unidirectional bus segments; and
first and second sets of silicon objects, including at least one common silicon object, which are coupled between segments in the first and second buses, respectively, wherein the common silicon object further comprises:
first and second bus inputs coupled to respective bus segments in the first and second buses, respectively;
first and second bus outputs coupled to subsequent bus segments in the first and second buses, respectively;
logic means coupled to receive a first digital value from the first bus input and for generating a new digital value; and
launch means for selectively passing the first digital value from the first bus input to the first bus output, replacing the first digital value with the new digital value on the first bus output, and passing the first digital value to the second bus output.

14. The logic array of claim 13 wherein the logic means comprises:
a landing register coupled to the first bus input for receiving the first digital value from the first bus input; and
a function-specific logic block coupled to an output of the landing register and having a first result output coupled to the launch means for providing the new digital value.

15. The logic array of claim 14 wherein the launch means comprises a first multiplexer having a first input coupled to the first bus input, a second input coupled to the first result output, and a third input coupled to the output of the landing register.

16. The logic array of claim 15 wherein the function-specific logic block comprises a second result output and the logic means further comprises:
a landing multiplexer, which multiplexes the first bus input and the second result output to the landing register.

17. The logic array of claim 15 wherein:
the first bus input and the first result output each has a data field and a control field; and
the first multiplexer multiplexes the data fields of the first bus input and the first result output independently of the control fields.

18. The logic array of claim 17 wherein the control fields of the first bus input and the first result output each includes multiple bits and the first multiplexer multiplexes each bit of the control fields independently of the other bits.

19. The logic array of claim 15 wherein:
the function-specific logic block further comprises a second result output; and
the launch means further comprises a second multiplexer having first and second multiplexer inputs coupled to the second bus input and the second result output, respectively, and having a multiplexer output coupled to the second bus output.

20. The logic array of claim 19 wherein:
the first multiplexer comprises a fourth multiplexer input coupled to the second bus input; and
the second multiplexer comprises a third multiplexer input coupled to the first bus input.

21. The logic array of claim 13 wherein:
the first set of silicon objects are adjacent to one another along the first bus;
the second bus extends through the logic array parallel to the first bus; and
the second set of silicon objects is a subset of the first set of silicon objects, and at least one of the bus segments in the second bus connects two of the silicon objects in the second set that are non-adjacent to one another along the first bus.

22. The logic array of claim 13 wherein the logic means comprises:
a landing register; and
a landing multiplexer which multiplexes the first and second bus inputs to the landing register.

23. A method of communicating digital values between silicon objects on an integrated circuit, the method comprising:
coupling a first set of silicon objects between respective unidirectional bus segments in a first unidirectional segmented bus;
coupling a second set of silicon objects between respective bus segments in a second unidirectional segmented bus, wherein at least one of the silicon objects is common to the first and second sets;
receiving a first digital value within the common silicon object from one of the bus segments in the first bus;
generating a new digital value within the silicon object;
selectively passing the first digital value from the common silicon object to another of the bus segments in the first bus;
selectively replacing the first digital value with the new digital value within the common silicon object and passing the new digital value from the common silicon object to the other bus segment in the first bus; and
selectively passing the first digital value from the common silicon object to one of the bus segments in the second bus.

24. The method of claim 23 wherein generating a new digital value comprises:
latching the first digital value in a landing register coupled to the first bus; and processing the first digital value within a function-specific logic block to generate the new digital value.

25. The method of claim 23 and further comprising:

receiving a second digital value within the common silicon object from one of the bus segments in the second bus; and multiplexing the first and second digital values into the landing register.

26. The method of claim 23 and further comprising:

latching the first digital value in a landing register; and selectively passing an output of the landing register to another of the bus segments in the first bus.

27. The method of claim 23 wherein:

the first digital value and the new digital value each have a data field and a control field; and the steps of selectively passing the first digital value and the step of replacing the first digital value are performed independently for the data fields and the control fields.

28. The method of claim 27 wherein the control fields of the first digital value and the new digital value each includes multiple bits and the steps of selectively passing the first digital value and the step of replacing the first digital value are performed independently for each bit of the control fields.

29. The method of claim 23 wherein the first and second buses extend along the integrated circuit in different directions.

30. The method of claim 29 wherein the second bus extends along the integrated circuit relative to the first bus in a direction selected from the group consisting of an opposite, parallel direction and an orthogonal direction.

31. The method of claim 23 wherein:

the first set of silicon objects are adjacent to one another along the first bus;

the second bus extends through the logic array parallel to the first bus; and the second set of silicon objects is a subset of the first set of silicon objects, and at least one of the bus segments in the second bus connects two of the silicon objects in the second set that are non-adjacent to one another along the first bus.

* * * * *